US006480128B1

(12) United States Patent
Bach et al.

(10) Patent No.: US 6,480,128 B1
(45) Date of Patent: Nov. 12, 2002

(54) HIGH-SPEED SAMPLE-AND-HOLD CIRCUIT WITH GAIN

(75) Inventors: Elmar Bach, Santa Cruz, CA (US); Sasan Cyrusian, Scotts Valley, CA (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/866,378

(22) Filed: May 25, 2001

(51) Int. Cl.[7] ................................................. H03M 1/12
(52) U.S. Cl. ........................ 341/122; 341/155; 327/96
(58) Field of Search ....................... 327/94–96; 341/122, 341/123, 155

(56) References Cited

U.S. PATENT DOCUMENTS

| | | | | | |
|---|---|---|---|---|---|
| 5,343,089 A | * | 8/1994 | Itakura et al. | ............... | 307/353 |
| 5,583,459 A | * | 12/1996 | Sone | ........................... | 327/95 |
| 6,198,314 B1 | * | 3/2001 | Kase | ........................... | 327/94 |

OTHER PUBLICATIONS

"Synchronous Recording Channels—PRML & Beyond", rev. 5.61 14.E. 18, 1999, published by Knowledge Tek, Inc., Broomfield, Colorado, pp. 1–6; 1–1 to 1–21; 2–1 to 2–28; 3–1 to 3–49; 4–1 to 4–16; 5–1 to 5–22; 6–1 to 6–21; 7–1 to 7–22; 8–1 to 8–12; 9–1 to 9–27; 10–1 to 10–27; 11–1 to 11–15; 12–1 to 12–11; A1 to A8; B1 to B–11; C–1 to C–9; D–1 to D–10; R–1 to R13.

"PRML: Seagate Uses Space Age Technology Today" available on the Internet at http://www.seagate.com/support/kb/disc/prml.html, 2 pages, last accessed Apr. 9, 2001.

"Technologies Storage—PRML" available on the Internet at http://www.idema.org/about/industry/ind_tech_prml.html, 1 page, last accessed Apr. 9, 2001.

"Reference Guide—Hard Disk Drives" available on the Internet at http://www.storagereview.com/guide2000/ref/hdd.goem/ (datarequirements or data RLL or dataPRML or data EPRML).html, 13 pages, last accessed Apr. 9, 2001.

"MR and PRML: Technologies in Synergy" available at on the Internet at http://www.lionsgate.com/Home/baden/public_html_index/SCSI/Quantum_White_Papers/MR_Head/MR, 4 pages, last accessed Apr. 9, 2001.

"A Tutorial on Convolutional Coding with Viterbi Decoding" available on the Internet at http://pw1.netcom/~chip.f/viterbi/(tutorial or algorthms).html, 10 pages, last accessed Apr. 9, 2001.

* cited by examiner

Primary Examiner—Howard L. Williams
(74) Attorney, Agent, or Firm—Brinks Hofer Gilson & Lione

(57) ABSTRACT

A sample-and-hold system that includes a first source follower having an input and an output and a second source follower that includes an input connected in series with the output of the first source follower and that furthermore comprises of a sample-and-hold switch connected to an output of the second source follower.

25 Claims, 2 Drawing Sheets

HIGH-SPEED SAMPLE-AND-HOLD CIRCUIT WITH GAIN

BACKGROUND OF THE INVENTION

1. Field of the Invention

The present invention relates to the field of sample-and-hold circuits. In particular, the present invention relates to sample-and-hold circuits for use in analog-to-digital conversion systems with a very high sampling rate.

2. Discussion of Related Art

As is well known in the art, settling of the input signal of an analog-to-digital converter during the sampling phase is critical to the performance of the analog-to-digital conversion. Preferably, such settling should be performed below one quarter of a least significant bit voltage of an analog-to-digital converter to provide a margin for the settling of the analog-to-digital converter input circuitry, e.g. the analog latch within a comparator bank.

An example of a known analog-to-digital conversion system is shown in FIG. 1. The analog-to-digital conversion system 100 includes a closed-loop driving amplifier 102, which has a gain, and a sample-and-hold switch 104. The gain of the driving amplifier 102 is defined by the ratio of the feedback resistors $R_2$ and $R_1$ and the sample-and-hold switch 104 can be built using a single NMOS transistor that is controlled by a sample clock 105. The input capacitance of the analog-to-digital converter 106 can perform as a storage capacitor during the hold phase. If the input signal of the sample-and-hold switch 104 changes within the hold period, settling to a new value is required in the sampling period. The voltage step that has to be performed between two adjacent samples can be as high as the full-scale analog-to-digital converter voltage. At very high sampling rates, it is not possible to settle such a voltage step using the closed-loop driving amplifier 102 driving the sample-and-hold switch 104 because of the limited unity gain bandwidth of the amplifier 102. The unity gain bandwidth has to be approximately an order of magnitude higher than the sample clock frequency if settling to one quarter of the least significant bit voltage of the analog-to-digital converter is to be obtained. The situation becomes even worse if the amplifier 102 has to provide gain because the closed-loop corner frequency, which is defining the settling time constant, decreases linearly with the gain compared to the unity gain bandwidth of the amplifier. Thereby, the maximum possible sampling rate using a sample-and-hold driver with an amplifier in a closed-loop configuration is limited.

Another example of an analog-to-digital conversion system that uses a closed-loop amplifier is shown in FIG. 2. The analog-to-digital conversion system 200 includes a closed-loop driving amplifier 202 that has an open-loop buffer circuit, such as an NMOS source follower 204, positioned at the output of the amplifier 202 to perform high-speed settling. The open-loop buffer circuit has gain-variations caused by technology variations during processing. Gain variations can be controlled by incorporation of a replica buffer, such as an additional NMOS source follower 206, in the feedback branch of the closed-loop amplifier 202. The replica buffer must be operated at the same current density as the output buffer. An implementation using a scaling factor N for both the (W/L)-ratio and the current-source currents can be chosen. Harmonic distortion in the output buffer, which can be due to variations of the threshold voltage of the source follower having a body effect, can be corrected for by the same replica buffer approach.

During operation of the analog-to-digital conversion system 200, a change of the output signal at nodes vom and vop up to the full-scale value of the analog-to-digital converter is possible between two adjacent samples at input signal frequencies close to half the sampling frequency. Therefore, during switching of the sample and hold switch 208 from hold to sampling phase, large voltage transients occur at voutm and voutp that have to be settled within half the clock phase. These transients cause the gate potential of the source-follower 204 to change due to a kickback effect. Because the gate of the source-follower buffer 204 is tied to the output gain nodes vgainm and vgainp of the gain-setting amplifier 202, a settling process of the closed loop amplifier 202 is triggered. During this settling process the output voltage at the gain nodes vgainm and vgainp of the core amplifier and hence the gate voltage of the source-follower 204 driving the sample and hold switch 208 will show ringing. This will alter the output voltage voutm and voutp of the sample and hold switch 208. Hence, at very high sampling rates settling to a quarter of a least significant bit voltage within the sampling period will be distorted and may not be accurately performed if the kickback can not be reduced and/or the ringing can be avoided. One way to avoid ringing during the mentioned settling process is to design the gain-setting amplifier for a high phase-margin. However, this limits the maximum signal bandwidth that can be processed by the gain-setting amplifier because the unity gain bandwidth has to be reduced.

Due to the level-shift performed by the NMOS source follower the common-mode voltage at the gain nodes vgainm and vgainp is very high. Hence it is not possible to achieve a high DC gain of the amplifier at these nodes at low supply voltages below 2 V because the required drain-source voltages for the pull-up current-source, which is part of the amplifier 202 and can be a DC current source or the output of a current mirror controlled e.g. by the amplifier's input stage, is not high enough to use cascode transistors in order to improve the output impedance of the source. The high gain is required in order to set the gain of the total circuit by the ratio of the feedback resistors $R_2$ and $R_1$ and to achieve low harmonic distortion. If the amplifier's gain is not sufficiently high, i.e. >50 dB, gain variations due to process variations will alter the total gain of the system.

A high gain might be obtained in case both the output voltage range and the output common-mode voltage are significantly reduced. However, a limited output range results in a limited analog-to-digital converter full-scale range, which immediately reduces the analog-to-digital converter's performance due to analog noise.

In summary, prior analog-to-digital conversion systems that have a sample-and-hold switch driven by closed-loop amplifiers have several shortcomings. For example, such analog-to-digital conversion systems have longer settling times at maximum input voltage steps that occur at input signal frequencies close to the Nyquist frequency, i.e. half the sampling frequency. During the sampling phase, at very high sampling rates a closed-loop amplifier circuit is not capable of settling a full-scale voltage step at the output of the sample-and-hold switch to below one quarter of an analog-to-digital converter least significant bit voltage at typical analog-to-digital converter resolutions up to 6 bit and a differential full-scale voltage of up to 1V peak-to-peak. Such large signal voltage steps occur at input signal frequencies close to the Nyquist frequency. Accordingly, if settling to a quarter of an analog-to-digital converter least significant bit at typical analog-to-digital converter resolutions up to 6 bit and a differential full-scale voltage of up to 1V peak-to-peak is required to provide headroom for the settling of the first analog latch stage of the analog-to-digital converter, the maximum sampling rates are limited.

Another problem of analog-to-digital conversion systems that use a closed-loop amplifier and single open-loop source-followers to drive the sample-and-hold switch is that for signal frequencies near the Nyquist frequency, incomplete settling of maximum input voltage steps can occur due to ringing of the gain-setting amplifier caused by the kickback onto the amplifier's gain-node. Incomplete settling introduces sampling errors and can be the cause of harmonic distortion of the analog-to-digital conversion system. If ringing is avoided by design of the gain-setting amplifier for higher phase margin, the maximum input signal-bandwidth is limited.

Furthermore, a high gain at the output of the amplifier renders it difficult to obtain a high DC gain at low supply voltages below 2 V due to the high common-mode voltage level at the amplifier's gain nodes. Thereby, the total gain of the system can vary with process variations. If the output voltage range and common-mode voltage are significantly reduced to enable circuitry in the amplifier that provides a higher DC then the analog-to-digital converter's performance will suffer due to the higher analog noise with respect to the full-scale range.

SUMMARY OF THE INVENTION

One aspect of the present invention regards a sample-and-hold system that includes a first source follower having an input and an output and a second source follower that includes an input connected in series with the output of the first source follower. A sample-and-hold switch connected to an output of the second source follower.

A second aspect of the present invention regards an analog-to-digital conversion system that includes an amplifier and a sample-and-hold system. The sample-and-hold system includes a first source follower having an input connected to an output of the amplifier, a second source follower that includes an input connected in series with an output of the first source follower and a sample-and-hold switch connected to an output of the second source follower. An analog-to-digital converter connected to an output of the sample-and-hold switch.

Each of the above aspects of the present invention provides the advantage of allowing for higher sampling rates and improved settling for sample-and-hold circuits used in analog-to-digital conversion systems.

Each of the above aspects of the present invention provides the advantage of sensing and correcting gain variations in sample-and-hold circuits used in analog-to-digital conversion systems.

Each of the above aspects of the present invention provides the advantage of operation at low supply voltages below 2 V.

The present invention, together with attendant objects and advantages, will be best understood with reference to the detailed description below in connection with the attached drawings.

DETAILED DESCRIPTION OF THE INVENTION

Figure 1:
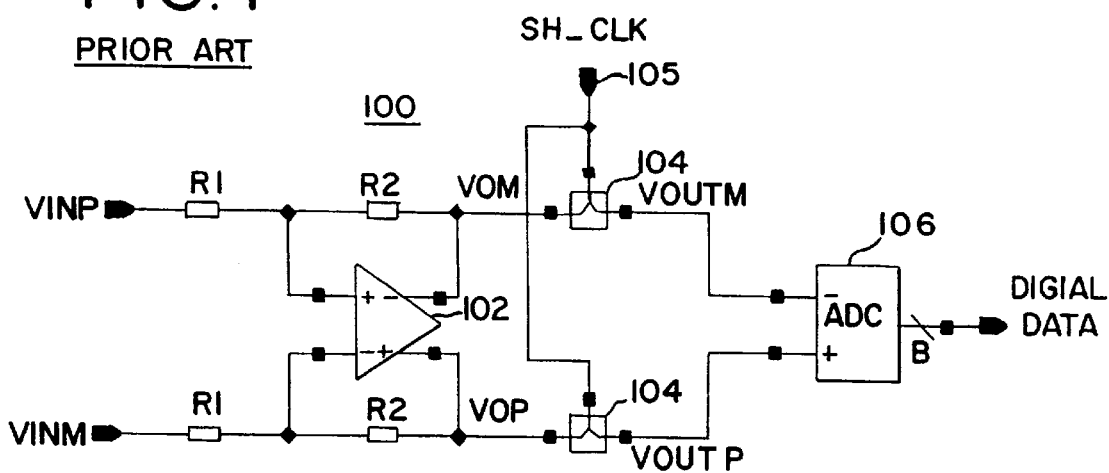
FIG. 1 schematically illustrates an embodiment of a known analog-to-digital conversion system.
Figure 2:
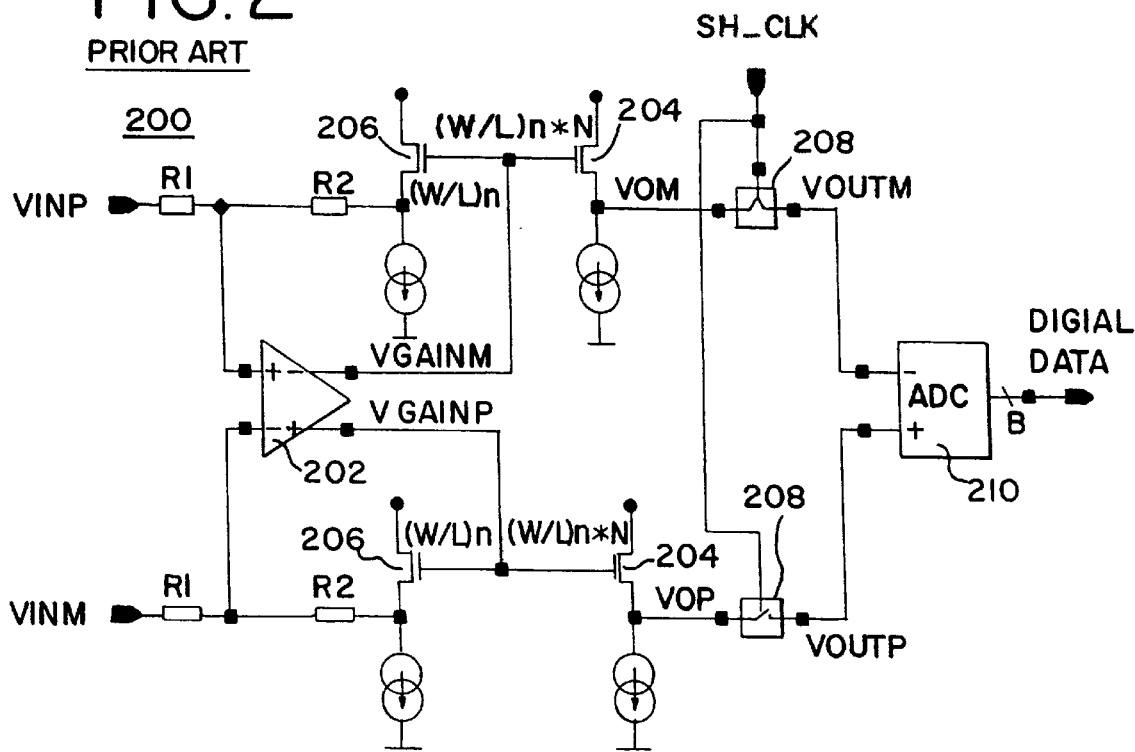
FIG. 2 schematically illustrates a second embodiment of a known analog-to-digital conversion system.
Figure 3:
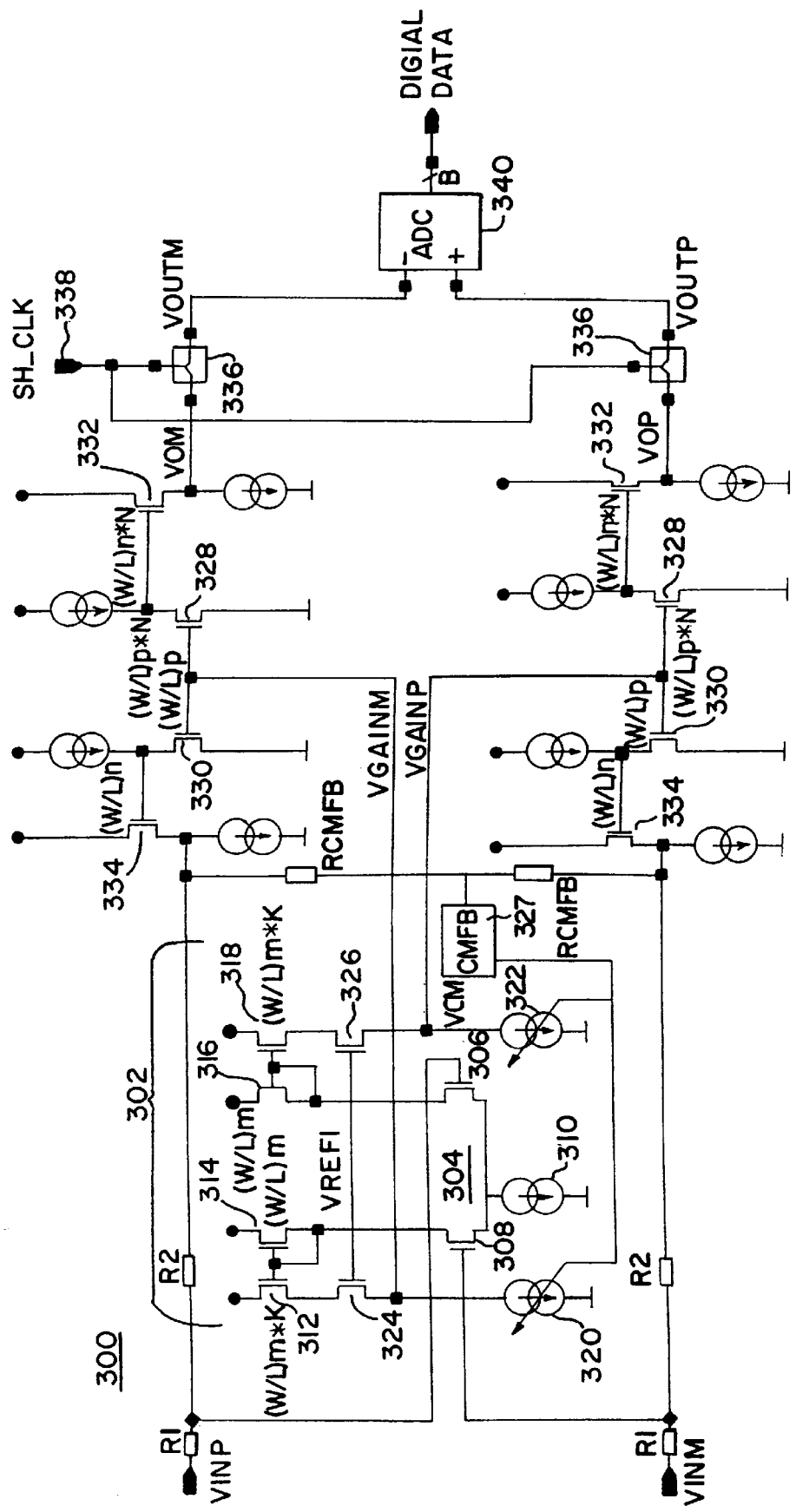
FIG. 3 schematically illustrates an embodiment of an analog-to-digital conversion system according to the present invention.

The following description of the present invention will be with respect to the analog-to-digital conversion system 300 shown in FIG. 3. It should be understood that the present invention can be applied to other embodiments of sample and hold circuits, such as high-speed sample and hold circuits in read/write channel chips for hard disk drives and high-speed sample and hold circuits in read channels for optical media, such as DVD or CD-ROM/CD-RW.

As shown in FIG. 3, the analog-to digital conversion system 300 includes a single stage operational transconductance amplifier (OTA) 302. The amplifier includes a differential input stage 304 that includes transistors 306 and 308. The differential input stage 304 is driven by a current source 310. Two PMOS current-mirrors including transistors 312 and 314 as well as 316 and 318, each with mirror ratio K, are connected to the transistors 306 and 308. The current mirrors 312 and 318 are connected to load current sources 320 and 322, respectively, via two PMOS cascode transistors 324 and 326. The load current sources 320 and 322 preferably each include an NMOS current source with cascode. The load current sources 320 and 322 are incorporated in the common-mode feedback loop. A common-mode feedback circuit 327 controls the common-mode voltage at the feedback output to be equal to a reference voltage vcm. Hence, the output common-mode voltage at nodes vom and vop is defined because of the replica buffer.

Due to the cascode transistors 324 and 326 and cascode transistors used in the NMOS current sources 320 and 322, a very high DC gain of the amplifier 302 can be obtained at nodes vgainm and vgainp. Therefore, the resistors $R_2$ and $R_1$ define the closed-loop gain. The design of the amplifier 302 as a single-stage amplifier enables high bandwidth operation, which can be achieved by setting the non-dominant poles at high frequencies. The additional non-dominant poles of the source follower buffer circuits 328, 332 are at very high frequencies too, because of the required low output impedance, i.e. the high transconductance, of the source follower transistor driving the sample and hold switch 336. The required output impedance, which defines the settling time constant together with the load capacitance, can be calculated by taking into account the duration of the sampling phase and the levels to which the output voltages should be settled, i.e. one quarter of a least significant bit voltage.

As shown in FIG. 3, the output signals vgainm and vgainp of the amplifier 302 are directed to the gates of the PMOS source-follower buffers 328 and the PMOS source-follower replicas 330. In order to avoid ringing due to kickback, the PMOS source-follower buffers 328 are placed in series with NMOS source-follower buffers 332. Additional PMOS source follower replicas 330 are placed in series with NMOS source follower replicas 334. The NMOS and PMOS source-follower replicas are incorporated in the feedback loop of the amplifier 302 to compensate for gain-loss in the source-follower buffers due to technology variations. Adding the PMOS source-follower buffers 328 in series with the output source follower 332, provides a low-impedance output for the gain-setting amplifier 302 thereby attenuating the kickback voltage due to transients at the output of the sample-and-hold switch 336 when switching from hold to sample phase, hence reducing distortion due to the above-mentioned settling process. The amplifier 302 can therefore be designed for maximum signal bandwidth, which is obtained by using a single-stage design. The presently preferred embodiment described above and shown in FIG. 3 can alternatively be implemented by reversing PMOS and NMOS transistors. Thereby, the design can be optimized for high or low input and output common-mode voltages.

The series connection between the PMOS and NMOS source-follower buffers 328, 332 forms in conjunction with a sample-and-hold switch 336 a sample-and-hold system that allows for the performance of a voltage up/down shift that allows keeping the internal common-mode voltages at an optimum level suited for high swing operation of the total sample-and-hold circuit at very low supply voltages below 2V. Hence, a high total gain and a high full-scale range of the analog-to-digital converter can be obtained that improves the performance in regard to analog noise. For example, a range of the differential output voltage up to about 1 V peak-to-peak can be obtained at a 2 V supply voltage. In particular, due to the up/down shift by one gate-source voltage within the NMOS/PMOS source-follower buffers, the voltage at the gain nodes vgainm and vgainp can be shifted to the middle of the supply voltage range. Hence, a high signal swing is possible at the gain nodes even at low supply voltages so that a high closed-loop gain can be set. The output impedance at the gain nodes vgainm and vgainp can be very high due to the sufficient headroom that is available to use cascode transistors on both pull-up and pull-down path, the later being the current sources 320 and 322 in FIG. 3. The current mirror ratio K of the PMOS mirrors 314, 312 and 316,318 can be greater than one, hence providing a significant increase of the amplifier's DC gain. For example, a high total gain of more than 50 dB can be obtained even at a supply voltage of 1.8 V. Hence, technology variations during the fabrication process do not influence the total gain of the system that is defined by the feedback resistors $R_2$ and $R_1$. In the presently preferred embodiment given in FIG. 3, the input common-mode voltage of the circuit can be set higher than the output common-mode voltage. A level-shift can be performed using a DC current flowing through the resistors $R_2$ and $R_1$.

The above-described ability of reducing kickback and the high-speed settling of the output signal using source-followers 332 that have a low output impedance, allows the amplifier 302 to be designed for maximum signal bandwidth. Furthermore, a high closed-loop gain and a high signal swing can be obtained at low supply voltages. For example, a −1 dB closed-loop corner frequency of 500 MHz at a DC gain of 8 dB and a sampling rate of 1 GHz can be achieved in a 0.18 µm CMOS technology with an analog-to-digital converter input capacitance of 4.5 pF and a supply voltage of 1.8 V. Settling of the differential output voltage between voutp and voutm can be performed within 500 ps to a settling band below 3.125 mV, which is related to a full-scale analog-to-digital converter range of 800 mV differential and a 6 bit analog-to-digital converter. Hence, a higher overall performance of the analog-to-digital conversion system 300 can be achieved at very high sampling rates.

Note that the dominant pole of the amplifier is located at the gain nodes vgainm and vgainp. In addition, the non-dominant poles are due to the current mirrors 314/312 and 316/318, the cascode transistors 324 and 326 and the two source followers 330 and 334. With the above definitions in mind, the dominant pole can be designed in proper relation to the non-dominant poles by dimensioning of the source-followers, the current-mirrors, the cascode transistors and the load current-sources. Note that very high signal bandwidth can be achieved because the non-dominant poles can be at high frequencies. No explicit compensation capacitor is required. The parasitic capacitances at the gain nodes vgainm and vgainp can be used instead. These capacitances are depending on the dimensions of the cascode transistors 324 and 326 as well as the transistors used in the current sources 320 and 322. Increasing the W/L ratio of the NMOS devices used in the current sources 320 and 322 can reduce the dominant-pole frequency by increasing the parasitic capacitance. The advantage is, that by increasing the W/L ratio of the current source transistors the saturation voltage of the current-source is reduced, which enables even higher signal swing at the gain nodes vgainm and vgainp. The frequency of the non-dominant poles due to the cascode transistors 324 and 326 can be optimized without changing the dominant pole frequency, by proper setting of the dimensions of the current sources 320 and 322. In addition, the open-loop output source-follower buffers 328 and 332 can have identical dimensions, i.e. transistor W/L ratios and identical current sources, as the corresponding replica buffers 330 and 334, which are incorporated in the feedback loop of the core amplifier 302. The source-follower buffer replica circuits 330 and 334 may also be a scaled-down version of the output source-follower buffers 328 and 332. In that case, all W/L ratios and the currents have to be scaled by the same factor N to achieve equal current densities in the transistors.

The output voltages at nodes vom and vop generated by the source follower buffers 328, 332 are directed to a pair of NMOS sample and hold switch transistors 336. The switches 336 are clocked by a sample clock 338.

The output common-mode voltage at nodes voutm and voutp can be optimized around 0.5V to obtain a high effective gate voltage of the NMOS switch transistors 336 in order to achieve a low channel resistance if the switches 336 are turned on during the sampling phase. The channel resistance is part of the total output impedance driving the input capacitance of the ADC and has to be as low as possible in order to achieve high-speed settling of the voltages at the output nodes voutm and voutp. The differential output voltage is generated around the common-mode voltage and is then directed to the analog-to-digital converter 340 that digitizes the signal in a well known manner. Note that during the hold phase, the voltage is stored on the input capacitance of the analog-to-digital converter 340. No additional storage capacitor is required.

The foregoing description is provided to illustrate the invention, and is not to be construed as a limitation. Numerous additions, substitutions and other changes can be made to the invention without departing from its scope as set forth in the appended claims.

We claim:

1. An analog-to-digital conversion system comprising:
   an amplifier;
   a sample-and-hold system, comprising:
      a first source follower comprising an input connected to an output of said amplifier;
      a second source follower comprising an input connected in series with an output of said first source follower; and
      a sample-and-hold switch connected to an output of said second source follower; and
   an analog-to-digital converter connected to an output of said sample-and-hold switch.

2. The analog-to-digital conversion system of claim 1, wherein said amplifier is a closed-loop amplifier.

3. The analog-to-digital conversion system of claim 2, wherein said first follower and said second follower produce low kickback of voltage transients out of said input of said first source follower to gain-nodes of said amplifier.

4. The analog-to-digital conversion system of claim 2, wherein said first follower and said second follower perform an up/down level shift that results in common-mode voltages being at an optimum level for high total gain operation of said amplifier at supply voltages below 2V.

5. The analog-to-digital conversion system of claim 2, wherein said amplifier generates a closed-loop gain that is defined by feedback resistors.

6. The analog-to-digital conversion system of claim 2, wherein said amplifier comprises a feedback loop that comprises a first source follower replica in series with a second source follower replica.

7. The analog-to-digital conversion system of claim 6, wherein said first source follower replica is identical to said first source follower and said second source follower replica is identical to said second source follower.

8. The analog-to-digital conversion system of claim 6, wherein said first source follower replica is scaled by a scaling factor N with respect to said first source follower and said second source follower replica is scaled by said scaling factor N with respect to said second source follower.

9. The analog-to-digital conversion system of claim 6, wherein said first source follower comprises a PMOS source-follower replica and said second source follower comprises an NMOS source-follower replica.

10. The analog-to-digital conversion system of claim 6, wherein during a hold phase of said sample-and-hold switch, said analog-to-digital converter stores voltage in an input capacitance without the need for an additional storage capacitor.

11. The analog-to-digital conversion system of claim 2, wherein input signals directed to an input of said analog-to-digital converter are settled quickly when said sample-and-hold switch is turned on during a sampling phase.

12. The analog-to-digital conversion system of claim 2, wherein said amplifier is compensated using a parasitic capacitance without the need of an additional compensation capacitor.

13. The analog-to-digital conversion system of claim 2, wherein said amplifier comprises a current-mirror with a mirror ratio K greater than one to increase a gain of said amplifier.

14. The analog-to-digital conversion system of claim 1, wherein said first follower and said second follower produce low kickback of voltage transients out of said input of said first source follower to gain-nodes of said amplifier.

15. The analog-to-digital conversion system of claim 1, wherein said first follower and said second follower perform an up/down level shift that results in common-mode voltages being at an optimum level for high total gain operation of said amplifier at supply voltages below 2V.

16. The analog-to-digital conversion system of claim 1, wherein said first source follower comprises a PMOS source follower.

17. The analog-to-digital conversion system of claim 16, wherein said second follower comprises an NMOS source follower.

18. The analog-to-digital conversion system of claim 17, wherein said amplifier is a closed-loop amplifier.

19. The analog-to-digital conversion system of claim 1, wherein said amplifier comprises a feedback loop that comprises a first source follower replica in series with a second source follower replica.

20. The analog-to-digital conversion system of claim 19, wherein said first source follower replica is identical to said first source follower and said second source follower replica is identical to said second source follower.

21. The analog-to-digital conversion system of claim 19, wherein said first source follower replica is scaled by a scaling factor N with respect to said first source follower and said second source follower replica is scaled by said scaling factor N with respect to said second source follower.

22. The analog-to-digital conversion system of claim 19, wherein said first source follower comprises a PMOS source-follower replica and said second source follower comprises an NMOS source-follower replica.

23. The analog-to-digital conversion system of claim 1, wherein said second follower comprises an NMOS source follower.

24. The analog-to-digital conversion system of claim 1, wherein input signals directed to an input of said analog-to-digital converter are settled quickly when said sample-and-hold switch is turned on during a sampling phase.

25. The analog-to-digital conversion system of claim 1, wherein said amplifier comprises a current-mirror with a mirror ratio K greater than one to increase a gain of said amplifier.

* * * * *